(12) United States Patent
Ohfuchi (10) Patent No.: US 8,860,106 B2
(45) Date of Patent: Oct. 14, 2014

(54) SPIN FILTER AND DRIVING METHOD THEREOF

(71) Applicant: Fujitsu Limited, Kawasaki (JP)

(72) Inventor: Mari Ohfuchi, Hadano (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/053,650

(22) Filed: Oct. 15, 2013

(65) Prior Publication Data

US 2014/0042572 A1 Feb. 13, 2014

Related U.S. Application Data

(63) Continuation of application No. PCT/JP2011/061958, filed on May 25, 2011.

(51) Int. Cl.

| H01L 29/76 | (2006.01) |
|---|---|
| H01L 29/94 | (2006.01) |
| H01L 21/00 | (2006.01) |
| H01L 43/02 | (2006.01) |
| H01L 29/16 | (2006.01) |
| H01L 29/66 | (2006.01) |
| H01L 43/12 | (2006.01) |
| H01L 29/778 | (2006.01) |
| H01L 29/423 | (2006.01) |

(52) U.S. Cl.
CPC ............ *H01L 43/02* (2013.01); *H01L 29/7613* (2013.01); *H01L 29/1606* (2013.01); *H01L 29/66984* (2013.01); *H01L 43/12* (2013.01); *H01L 29/1608* (2013.01); *H01L 29/7781* (2013.01); *H01L 29/4238* (2013.01)
USPC ............... 257/295; 257/422; 257/427; 438/3; 438/22; 365/145; 365/158

(58) Field of Classification Search
CPC .......... G11C 11/16; G11B 5/02; G11B 9/149; H01F 10/193; H01L 29/1606; H01L 43/02; H01L 43/12; H01L 29/7781; H01L 29/66984; H01L 29/4238; H01L 29/1608
USPC .......... 257/295, 414, 422, 427; 438/3, 22, 24, 438/48; 365/145, 158, 173
See application file for complete search history.

(56) References Cited

U.S. PATENT DOCUMENTS

| 6,355,953 B1 * | 3/2002 | Kirczenow .................... 257/295 |
| 2010/0102292 A1 | 4/2010 | Hiura et al. |
| 2011/0063758 A1 * | 3/2011 | Wang et al. ................ 360/324.2 |

FOREIGN PATENT DOCUMENTS

| JP | 2010-232511 | 10/2010 |
| JP | 2010-283009 | 12/2010 |
| WO | 2008-108383 | 9/2008 |

OTHER PUBLICATIONS

Ozaki, Taisuke et al., "Dual spin filter effect in a zigzag graphene nanoribbon", Physical Review B 81, 074522 (2010), pp. 075422-1 to pp. 075422-5.

(Continued)

*Primary Examiner* — Hsien Ming Lee
(74) *Attorney, Agent, or Firm* — Fujitsu Patent Center (57) ABSTRACT

A spin filter includes a first electrode configured to be formed with a zigzag graphene ribbon with an even number of rows extending in a first direction, and to have a magnetic moment in a second direction crossing with the first direction; a second electrode configured to be formed with a zigzag graphene ribbon with an even number of rows extending in the first direction, and to have a magnetic moment in the second direction; and a channel region configured to be placed between the first electrode and the second electrode, and to have an energy level allowing up-spin electrons or down-spin electrons to pass.

14 Claims, 8 Drawing Sheets

(56) References Cited

OTHER PUBLICATIONS

Jin, Chuanhong et al., "Deriving Carbon Atomic Chains from Graphene", Physical Review Letters, PRL 102, 205501 (2009), pp. 205501-1-pp. 205501-4.

Cai, Jinming et al., "Atomically precise bottom-up fabrication of graphene nanoribbons", Nature, vol. 466, Jul. 22, 2010, pp. 470-pp. 473.

Fujita, Mitsutaka, "Peculiar Localized State at Zigzag Graphite Edge", Journal of Physical Society of Japan, vol. 65, No. 7, Jul. 1996, pp. 1920-pp. 1923.

International Search Report, mailed in connection with PCT/JP2011/061958 and mailed Jul. 12, 2011.

* cited by examiner

SPIN FILTER AND DRIVING METHOD THEREOF

CROSS-REFERENCE TO RELATED APPLICATIONS

This application is a continuation application of International Application PCT/JP2011/061958 filed on May 25, 2011 which designates the U.S., the entire contents of which are incorporated herein by reference.

FIELD

The disclosures herein generally relate to a spin filter using a zigzag graphene ribbon and a driving method thereof.

BACKGROUND

As CMOS technology using silicon is getting close to a limit of fine processing, alternative channel materials have been searched for extending the lifetime of the technology. As most promising candidates of such materials, attention is drawn to nanocarbon materials represented by carbon nanotube and graphene, on which various research and development have been conducted.

It is expected that new information processing concepts may be discovered through research and development of nanocarbon materials, which go beyond CMOS technology, such as spintronics. Results ever obtained include spin injection into carbon nanotube and graphene at room temperature, long spin relaxation with order of μm, and the like, with which various properties are observed that are suitable for spintronics materials.

A spin filter is considered to be a basic device in spintronics for obtaining spin-polarized current. In recent years, a spin filter is proposed that uses a zigzag graphene nanoribbon with an even number of rows having a magnetic moment. By forming two electrodes using zigzag graphene nanoribbons with an even number of rows having magnetic moments, and having magnetic moment directions of the electrodes be anti-parallel with each other, a spin filter can be formed in which only electrons having spin in one direction are conducted.

RELATED-ART DOCUMENTS

Non-Patent Document

[Non-Patent Document 1] Taisuke Ozaki et al., "Dual spin filter effect in a zigzag graphene nanoribbon", Physical Review B 81, 074522, 2010

[Non-Patent Document 2] Chuanhong Jin et al., "Deriving carbon atomic chains from graphene", Physical Review Letters 102, 205501, 2009

[Non-Patent Document 3] Jinming Cai et al., "Atomically precise bottom-up fabrication of graphene nanoribbons", Nature, Vol. 466, Jul. 22, 2010

However, in such a conventional spin filter described above, two electrodes need to be given magnetic moments in directions reverse to each other, respectively, which may not be easy to manufacture. Also, to improve usability as a spin filter, it is desirable that either of up-spin electrons or down-spin electrons can be selected to make them conduct.

SUMMARY

According to at least one embodiment of the present invention, a spin filter includes: a first electrode configured to be formed with a zigzag graphene ribbon with an even number of rows extending in a first direction, and to have a magnetic moment in a second direction crossing with the first direction; a second electrode configured to be formed with a zigzag graphene ribbon with an even number of rows extending in the first direction, and to have a magnetic moment in the second direction; and a channel region configured to be placed between the first electrode and the second electrode, and to have an energy level allowing up-spin electrons or down-spin electrons to pass.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

In the following, embodiments of the present invention will be described with reference to the drawings.

According to at least one embodiment of the present invention, it is possible to provide a spin filter in which two electrodes are formed with respective zigzag graphene ribbons with an even number of rows having magnetic moments in the same direction, with which these electrodes can be easily given magnetic moments using an external magnetic field or the like.

Also, according to at least one embodiment of the present invention, it is possible to provide a driving method of a spin filter in which either of up-spin electrons or down-spin electrons can be selected to be passed.

Figure 1:
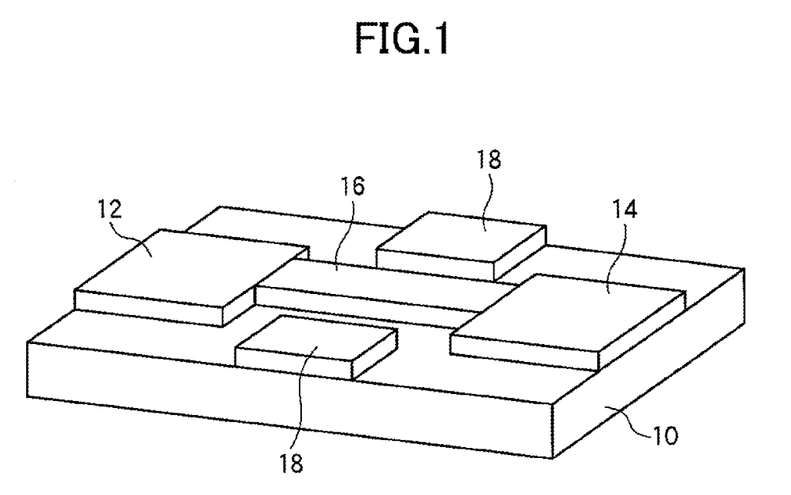
FIG. 1 is a perspective view illustrating a structure of a spin filter according to an embodiment.
Figure 2:
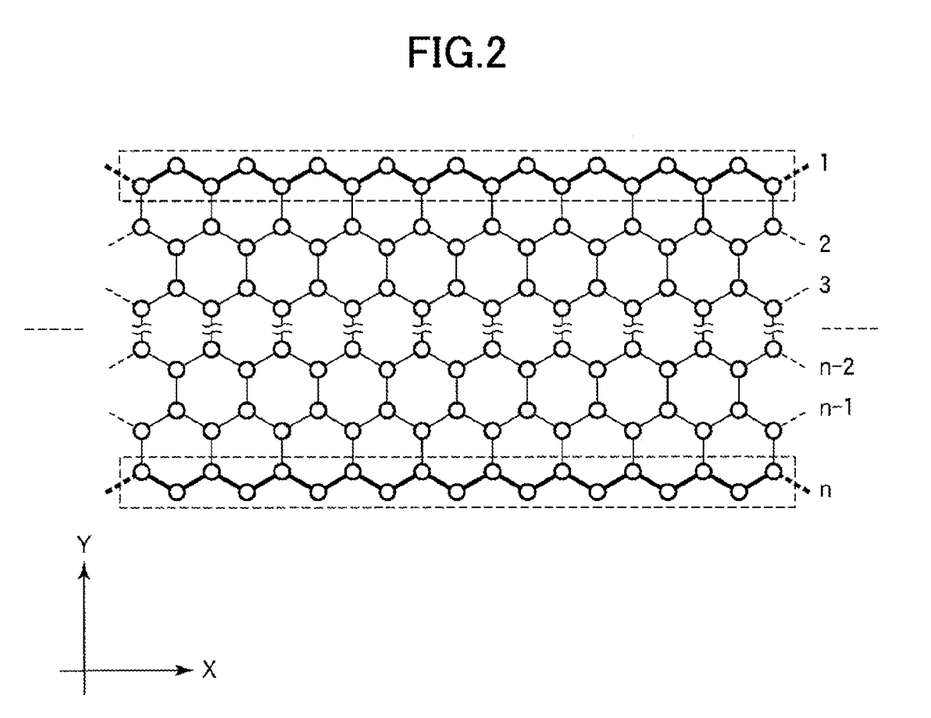
FIG. 2 is a schematic view illustrating a structure of a zigzag graphene nanoribbon.

First, a structure of a spin filter will be described with reference to FIGS. 1-2 according to the present embodiment. FIG. 1 is a perspective view illustrating a structure of a spin filter according to the present embodiment. FIG. 2 is a schematic view illustrating a structure of a zigzag graphene nanoribbon.

According to the present embodiment, the spin filter 10 includes a source region 12 as a first electrode, a drain region 14 as a second electrode, and a channel region 16 placed between the source region 12 and the drain region 14 as illustrated in FIG. 1. The spin filter also includes gate electrodes 18 separately placed adjacent to the channel region 16.

The source region 12 and the drain region 14 are formed with respective zigzag graphene ribbons with an even number of rows having magnetic moments in the same direction.

A zigzag graphene nanoribbon is a one-dimensionally (or quasi-one-dimensionally) shaped graphene in which carbon atoms are arranged zigzaggedly along longitudinal edges of it. For example, as illustrated in FIG. 2, in a one-dimensionally shaped graphene extending in an X-direction, carbon atoms along the edges (areas enclosed in dashed lines in FIG. 2) are arranged zigzaggedly in an X-direction (thick lines in FIG. 2).

Here, "even number of rows" means that the rows are arranged in a Y-direction, and the number of the row is an even number, where each of the rows includes carbon atoms placed zigzaggedly in an X-direction. A zigzag graphene nanoribbon illustrated in FIG. 2 has n rows arranged in a Y-direction, and each of the rows includes carbon atoms placed zigzaggedly in an X-direction. A zigzag graphene nanoribbon with an even number of rows is a graphene nanoribbons where n is an even number. The number of rows of carbon atoms in a zigzag graphene nanoribbon that forms a source region 12 may be different from or the same as the number of rows of carbon atoms in a zigzag graphene nanoribbon that forms a drain region 14, as long as both row numbers are even numbers.

It is known that graphene reveals properties that are not observed with usual graphene when graphene is structured into a nano-sized ribbon shape. Graphene with such a structure is called a "graphene nanoribbon". A width of a graphene nanoribbon is not specifically defined, but, for example, a width of about 100 nm in a Y-direction may be considered as a dimension of a graphene ribbon. In case of a graphene ribbon having the width of 100 nm, the number of rows n is about 470 where each of the rows includes carbon atoms placed zigzaggedly in an X-direction. A graphene ribbon with a width in an order of nanos has characteristics different from those in usual graphene.

The zigzag graphene nanoribbons forming the source region 12 and the drain region 14 have magnetic moments in a direction perpendicular to the extending direction of the graphene ribbons, which corresponds to a Y-direction in FIG. 2. The source region 12 and the drain region 14 are arranged so that they have their magnetic moments in the same (parallel) direction.

The magnetic moments of the source region and the drain region 14 can be given with an external magnetic field generated by a ferromagnetic material placed in the neighborhood of the source region 12 and the drain region 14, or with spin injection.

The channel region 16 is placed between the source region 12 and the drain region 14, and is formed with a substance that has its energy level in an energy region where only up-spin electrons pass or in an energy region where only down-spin electrons pass. By forming the channel region 16 with such a substance, it is possible to selectively pass only up-spin electrons or down-spin electrons.

As an example of a substance forming the channel region 16 is, for example, a substance with its energy level around the Fermi level of the zigzag graphene nanoribbon that forms the source region 12 and drain region 14 (up to about 1 eV). The substance forming the channel region 16 will be described later in detail with its behavior.

The gate electrodes 18 are provided for changing the energy level of the channel region 16 by having the channel region 16 applied with an electric field. In FIG. 1, although two gate electrodes 18 are provided stepping over the channel region 16, the two electrodes are not necessarily provided, but only one gate electrode 18 may be provided at one side. Also, the gate electrodes 18 do not need to be placed adjacent to the channel region 16 in a plane, but may be placed up and under the channel region 16. Also, when forming a spin filter that passes only either of up-spin electrons or down-spin electrons, the gate electrodes 18 are not necessarily required.

Next, basic behavior of the source region and the drain region 14 will be described with reference to FIGS. 3-8 when they form a junction and have magnetic moments in the same direction.

Figure 3:
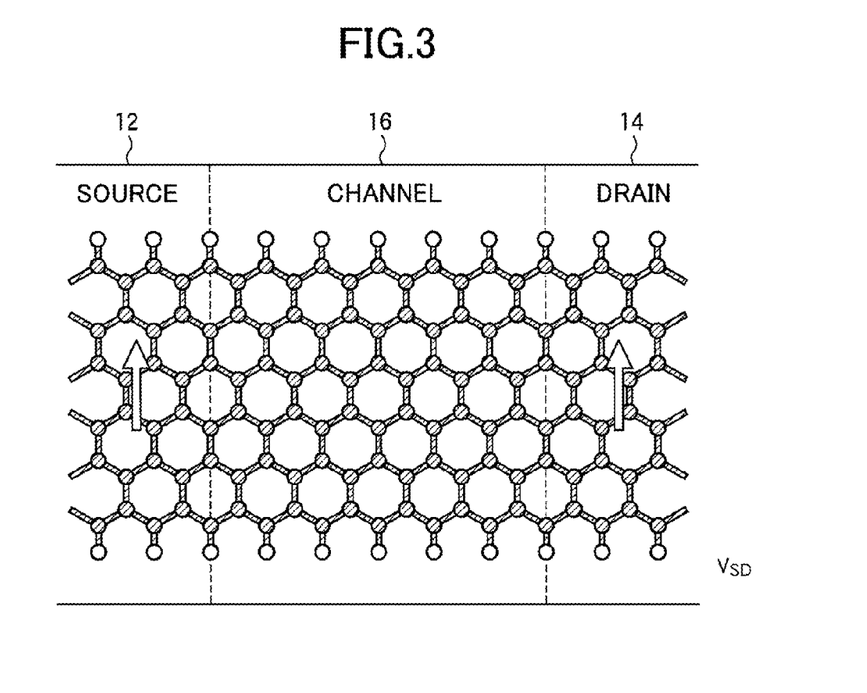
FIG. 3 is a schematic view illustrating a structured object in which a source region and a drain region are formed with a graphene nanoribbon with an even number of rows having magnetic moments in a same direction.
Figure 4:
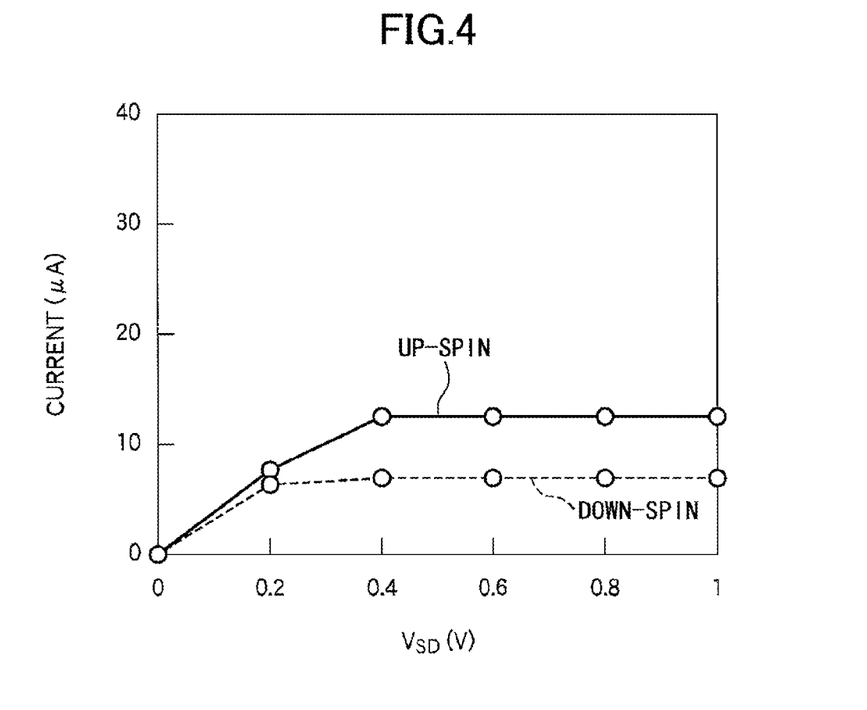
FIG. 4 is a schematic view illustrating a relationship between a spin-polarized current and a bias voltage in the structured object in FIG. 3.
Figure 5:
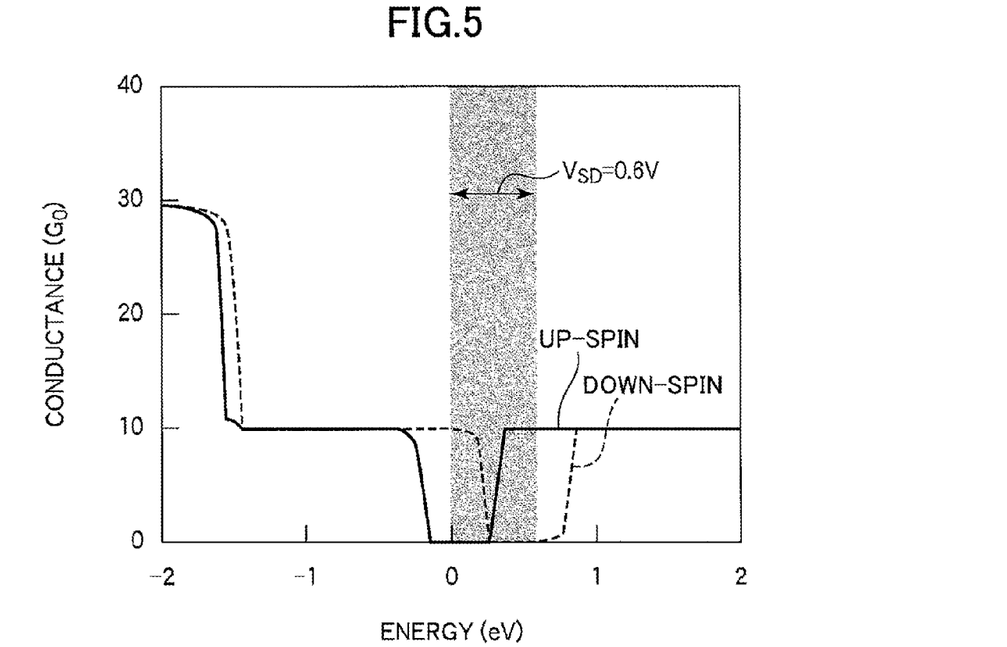
FIG. 5 is a schematic view illustrating a relationship between conductance and energy in the structured object in FIG. 3.
Figure 6:
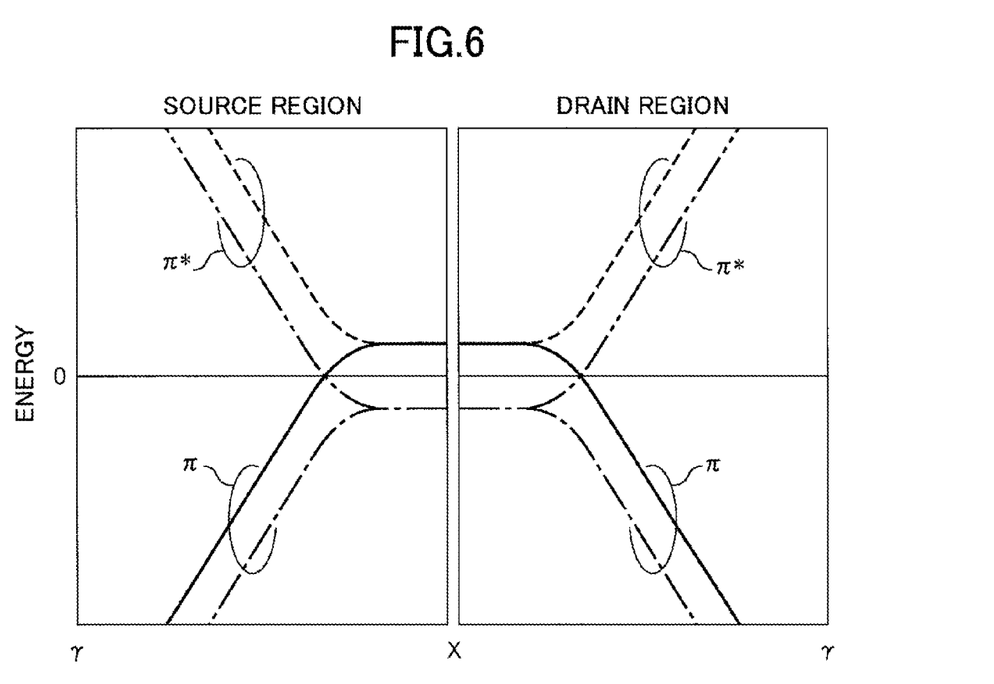
FIG. 6 is a schematic view illustrating an energy band structure of the structured object in FIG. 3.
Figure 7:
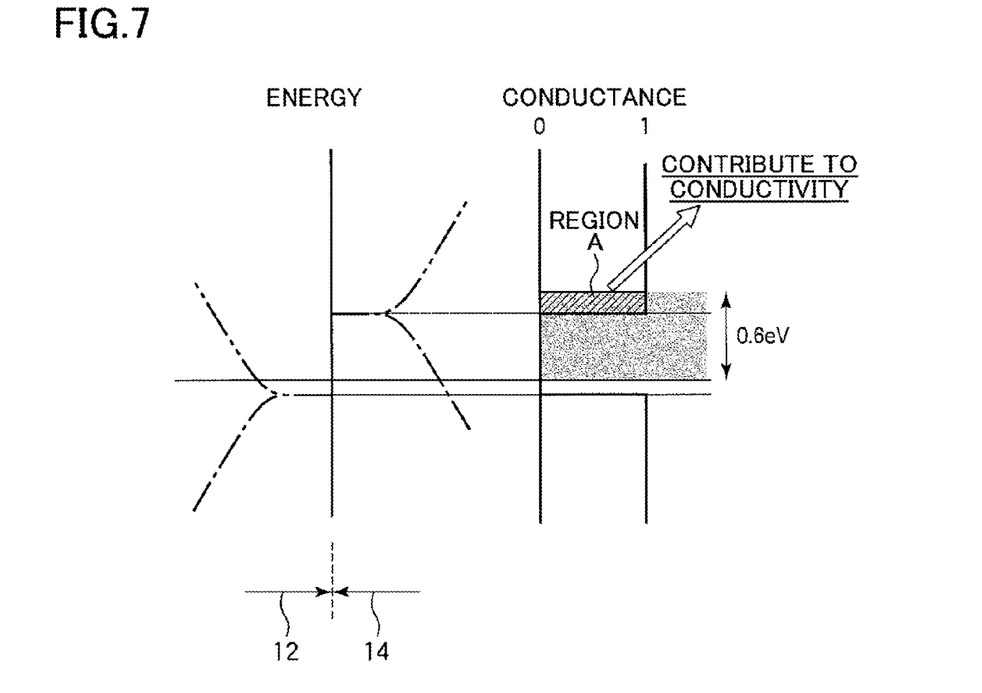
FIG. 7 is a first schematic view illustrating behavior of the structured object in FIG. 3.
Figure 8:
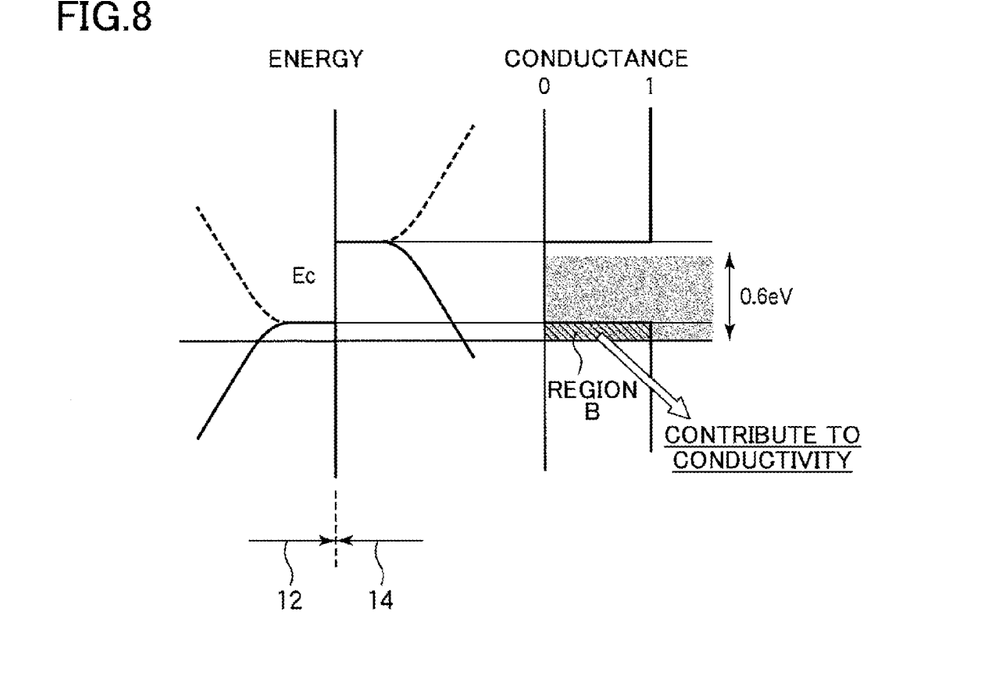
FIG. 8 is a second schematic view illustrating behavior of the structured object in FIG. 3.

FIG. 3 is a schematic view illustrating a structured object in which a source region 12 and a drain region 14 are formed with a graphene nanoribbon with an even number of rows having magnetic moments in the same direction. FIG. 4 is a schematic view illustrating a relationship between a spin-polarized current and a bias voltage in the structured object in FIG. 3. FIG. 5 is a schematic view illustrating a relationship between conductance and energy in the structured object in FIG. 3. FIG. 6 is a schematic view illustrating energy band structures of the structured object in FIG. 3. FIGS. 7-8 are schematic views illustrating behavior of the structured object in FIG. 3.

As illustrated in FIG. 3, assume that a zigzag graphene nanoribbon with six rows forms the source region 12, the channel region 16 and the drain region 14, which constitute a structured object, and the source region 12 and drain region 14 are given magnetic moments in the same direction. The edges of the zigzag graphene nanoribbon are terminated with hydrogen.

FIG. 4 is a graph illustrating a result of simulation of a spin-polarized current when applying bias voltage $V_{SD}$ between the source region 12 and the drain region 14 of the structured object illustrated in FIG. 3, using a non-equilibrium Green function method based on first principles. Also, FIG. 5 is a graph illustrating a relationship between conductance and energy in the structured object in FIG. 3 that is obtained with a simulation using a non-equilibrium Green function method based on first principles.

As illustrated in FIG. 4, when applying bias voltage $V_{SD}$ between the source region 12 and the drain region 14, both up-spin electrons and down-spin electrons conduct between the source region 12 and the drain region 14. Namely, the structured object illustrated in FIG. 3 does not function as a spin filter.

However, a current value at a particular bias voltage $V_{SD}$ is obtained by taking an integral of conductance in an energy range corresponding to the bias voltage $V_{SD}$ (the shaded part in FIG. 5). Energy regions with a finite value of conductance for up-spin and down-spin are different from each other as illustrated in FIG. 5. This difference is derived from an electron state specific to a zigzag graphene nanoribbon with an even number of rows in which the valance band has an anti-symmetric electron state (n state) with respect to the center of the width of the ribbon, whereas the conductance band has a symmetric electron state (n* state) with respect to the center of the width of the ribbon.

FIG. 6 is a schematic view illustrating energy band structures of the structured object in FIG. 3. In FIG. 6, two band structures that assume the source region 12 and the drain region 14 are drawn symmetrically with respect to point X at the center.

In FIG. 6, a solid line represents a band structure of n state of down-spin, a dotted line represents a band structure of n* state of down-spin, a dashed-dotted line represents a band structure of n state of up-spin, and the dashed-two dotted line represents a band structure of n* state of up-spin.

As illustrated in FIG. 6, the energy bands of the structure object illustrated in FIG. 3 shows exchange splitting in the neighborhood of the Fermi level (energy=0), and the energy of the up-spin band is smaller than the energy of the down-spin band.

FIGS. 7-8 are schematic views of the energy band structure and conductance when 0.6V of the bias voltage $V_{SD}$ is applied between the source region 12 and the drain region 14. FIG. 7 illustrates a state of up-spin electrons, and FIG. 8 illustrates a state of down electrons. Here, the channel region 16 is omitted in FIGS. 7-8.

If the source region 12 and the drain region 14 have magnetic moments in the up-spin direction, an energy region (region A in FIG. 7) appears in the higher energy side of the integral range (the shaded part in FIG. 7), through which only up-spin electrons pass. Also, an energy region (region B in FIG. 8) appears in the lower energy side of the integral range (the shaded part in FIG. 8), through which only down-spin electrons pass. If the magnetic moment has a reverse direction, the spin directions of electrons that pass region A and region B have reverse directions, respectively.

Next, behavior of the spin filter will be described with reference to FIGS. 9-16 according to the present embodiment.

Figure 9:
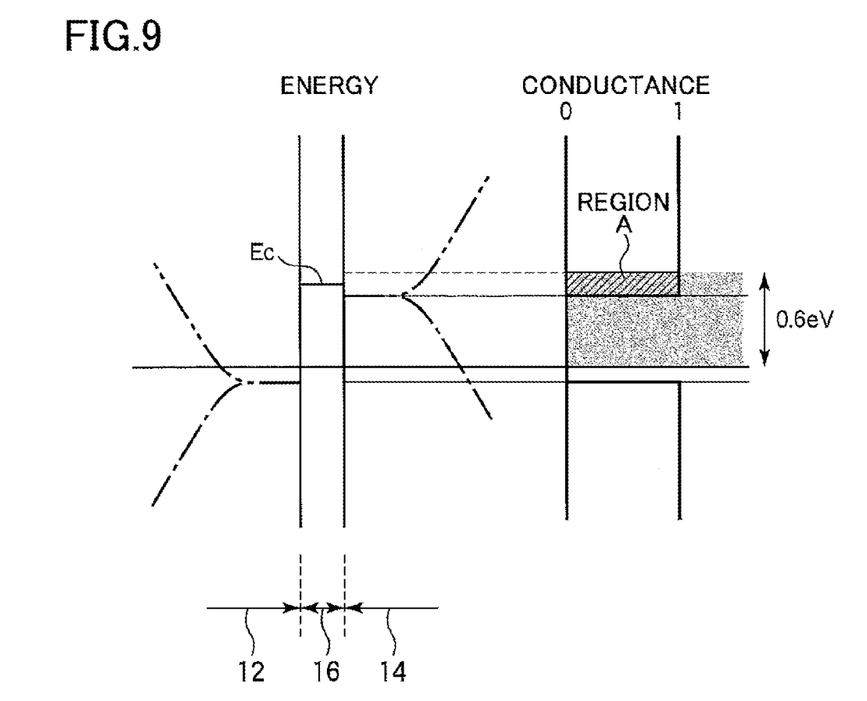
FIG. 9 is a first schematic view illustrating behavior of a spin filter according to an embodiment.
Figure 10:
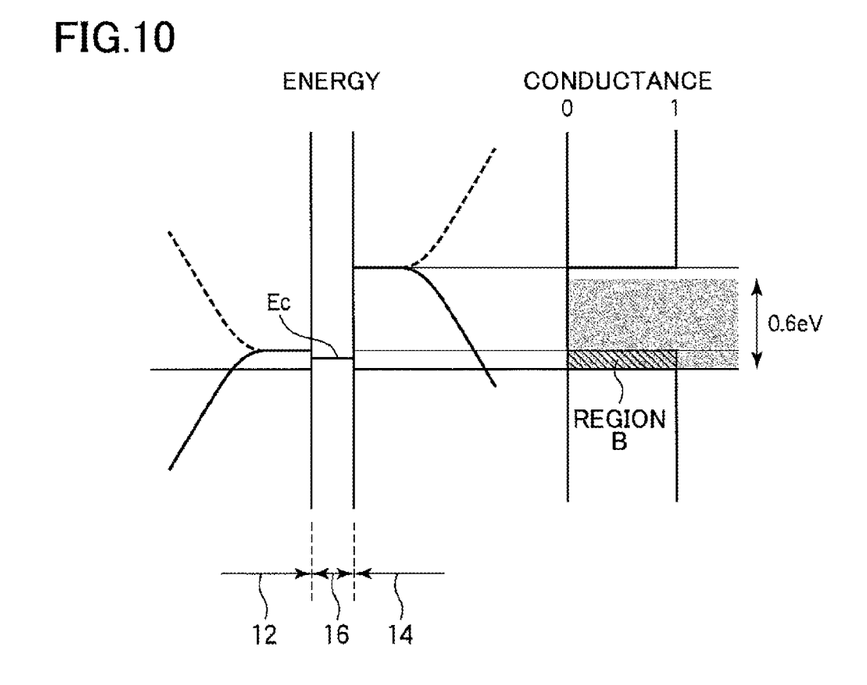
FIG. 10 is a second schematic view illustrating behavior of a spin filter according to an embodiment.
Figure 11:
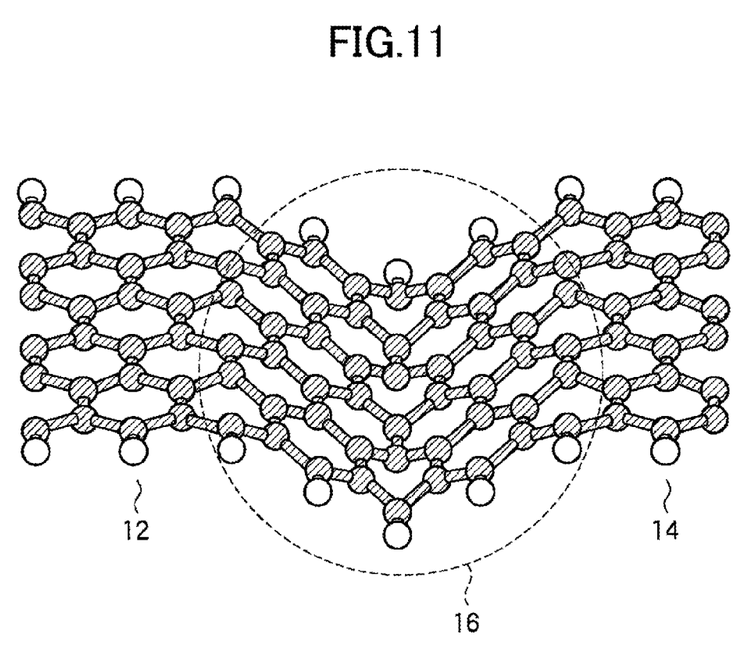
FIG. 11 is a schematic view illustrating an example of a substance that forms a channel region in a spin filter according to an embodiment.
Figure 12A:
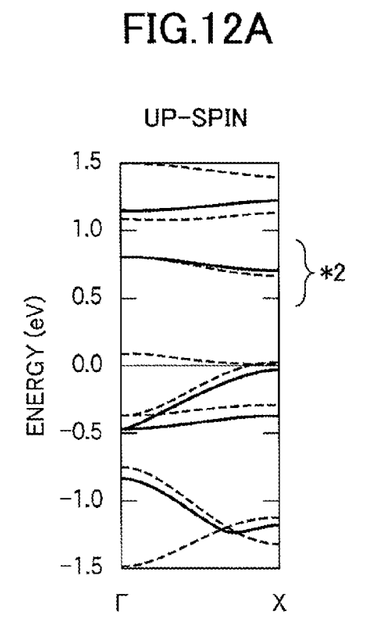
FIGS. 12A-12B are schematic views illustrating energy band structures of the substance that forms the channel region in FIG. 11.
Figure 12B:
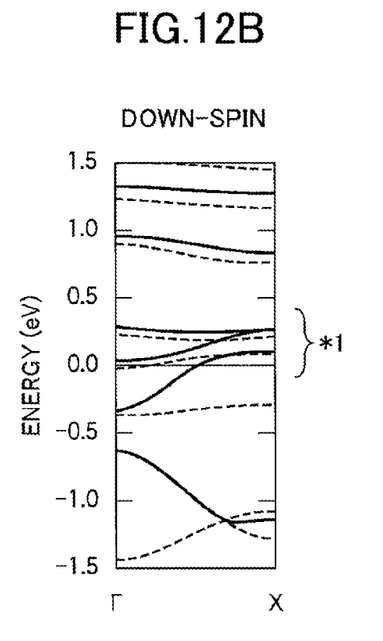
Figure 13:
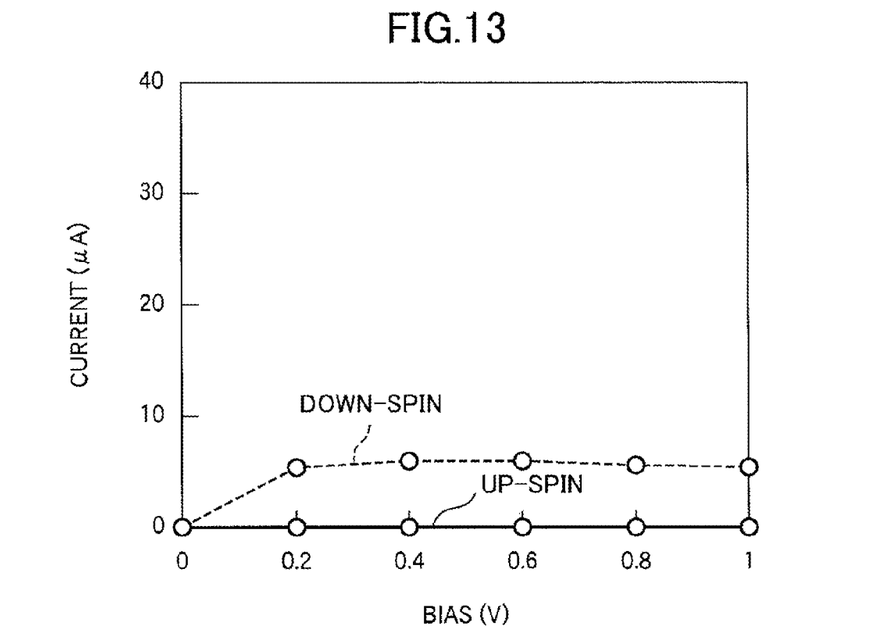
FIG. 13 is a schematic view illustrating a relationship between a spin-polarized current and a bias voltage in a spin filter using the structured object in FIG. 11 as a substance for forming the channel region according to an embodiment.
Figure 14:
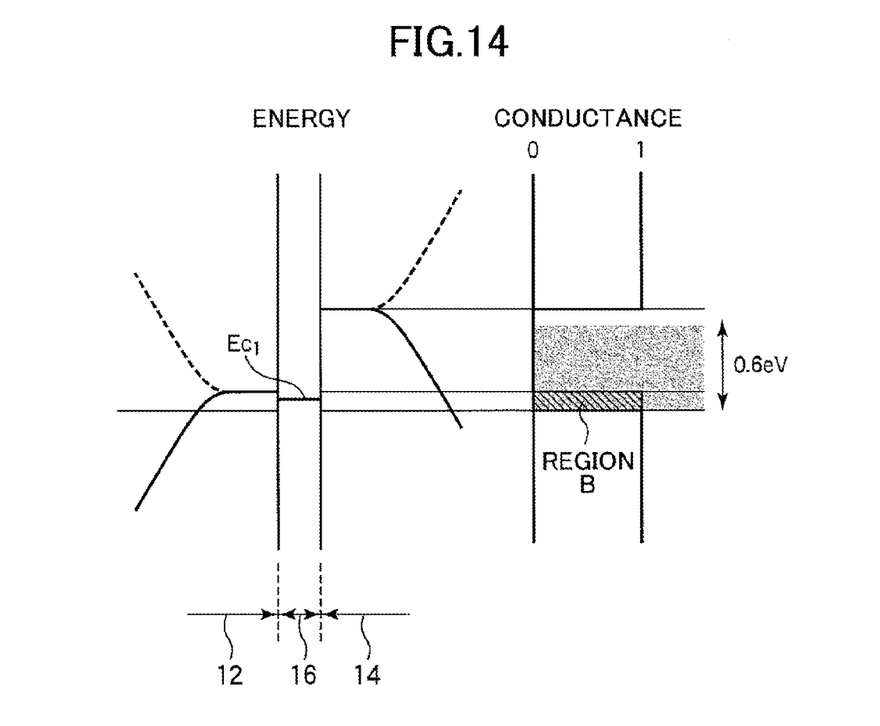
FIG. 14 is a first schematic view illustrating behavior of a spin filter using the structured object in FIG. 11 as a substance for forming the channel region according to an embodiment.
Figure 15:
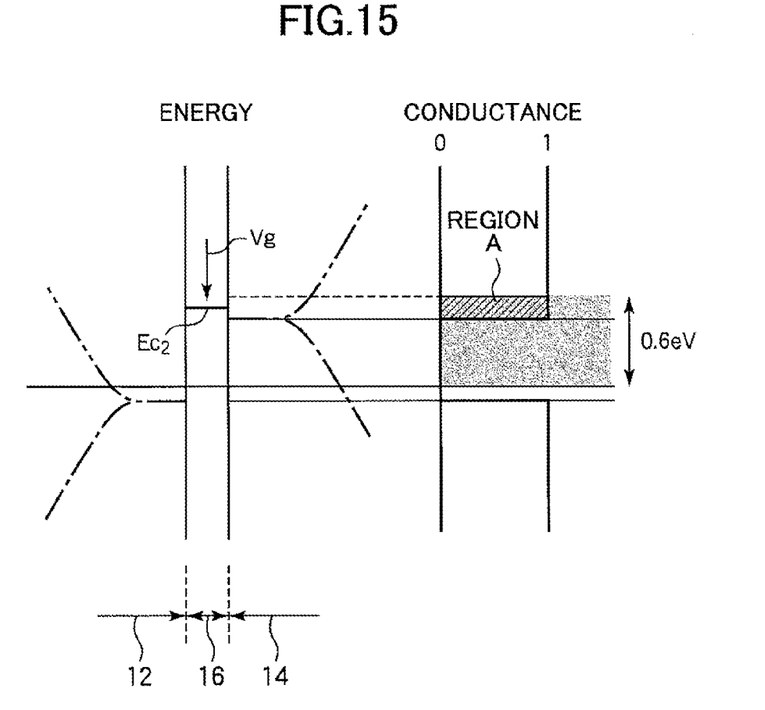
FIG. 15 is a second schematic view illustrating behavior of a spin filter using the structured object in FIG. 11 as a substance for forming the channel region according to an embodiment.
Figure 16:
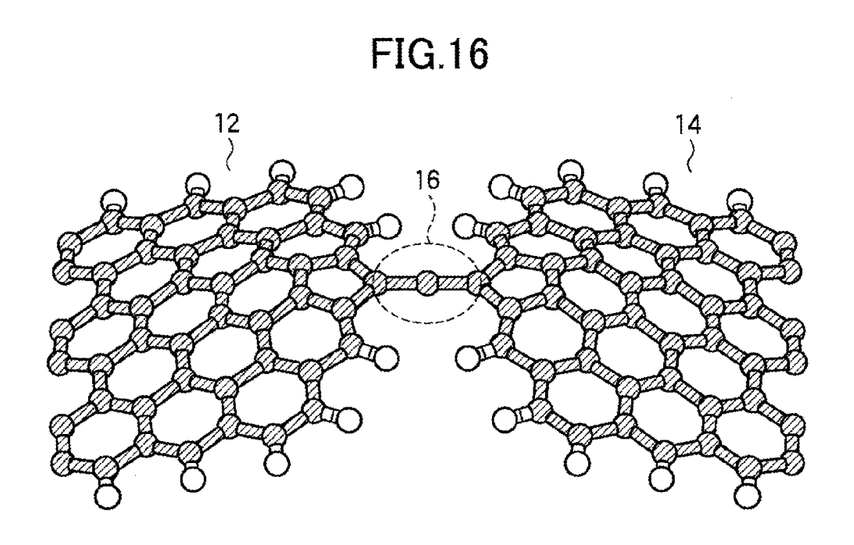
FIG. 16 is a schematic view illustrating another example of a substance that forms a channel region in a spin filter according to an embodiment.

FIGS. 9-10 are schematic views illustrating behavior of the spin filter according to the present embodiment. FIG. 11 is a schematic view illustrating an example of a substance that forms the channel region in the spin filter according to the present embodiment. FIG. 12 is a schematic view illustrating an energy band structure of the substance that forms the channel region in FIG. 11. FIG. 13 is a schematic view illustrating a relationship between a spin-polarized current and a bias voltage in a spin filter using the structured object in FIG. 11 as the substance for forming the channel region according to the present embodiment. FIGS. 14-15 are schematic views illustrating behavior of the spin filter using the structured object in FIG. 11 as the substance for forming the channel region according to the present embodiment. FIG. 16 is a schematic view illustrating another example of a substance that forms the channel region in the spin filter according to the present embodiment.

The channel region 16 in the spin filter is formed with a substance described below for selectively passing up-spin electrons or down-spin electrons using the above characteristics of the structured object in FIG. 3 according to the present embodiment.

Namely, according to the present embodiment, the channel region 16 of the spin filter is formed with a substance that has an energy level in an energy region that passes only up-spin electrons or in an energy region that passes only down-spin electrons.

For example, a substance having characteristics as illustrated in FIG. 9 is used that has the energy level Ec in the energy region A and has no energy levels in the energy region B. In this case, down-spin electrons cannot pass the channel region 16, and only up-spin electrons can pass the channel region 16. Namely, it functions as a spin filter that passes only up-spin electrons.

Alternatively, a substance having characteristics as illustrated in FIG. 10 is used that has the energy level Ec in the energy region B and has no energy levels in the energy region A in the spin filter according to the present embodiment. In this case, up-spin electrons cannot pass the channel region 16, and only down-spin electrons can pass the channel region 16. Namely, it functions as a spin filter that passes only down-spin electrons.

By changing the substance forming the channel region 16 in this way, the type of spin to be filtered can be changed.

The channel region 16 does not necessarily have a magnetic moment, and energy levels of up-spin and down-spin may be degenerated as long as it has the energy level Ec in either of the energy regions A or B.

A substance that forms the channel region 16 does not necessarily have the energy level Ec in the energy region A or B. The energy level Ec of the channel region 16 can be moved into either of the energy region A or B by having the channel region 16 applied with an electric field. The electric field applied to the channel region 16 can be controlled by gate voltage Vg applied to the gate electrodes 18.

Also, by appropriately controlling the gate voltage Vg applied to the gate electrodes 18, it is possible to selectively pass either of up-spin electrons or down-spin electrons.

For example, assume that the channel region is formed with a substance that has no magnetic moment, and energy levels of both spin directions are in a degenerated state. Also assume that the energy level Ec of the channel region 16 is in the energy region A when a voltage is not applied to the gate electrodes 18.

In this case, it functions as a spin filter that passes only up-spin electrons when a voltage is not applied to the gate electrodes 18 (see FIG. 9). On the other hand, by applying gate voltage Vg to the gate electrodes 18 to move down the energy level of the channel region 16 into the range of the energy region B, it functions as a spin filter that passes only down-spin electrons (see FIG. 10).

Here, considering an operation voltage of a general electron device, it is desirable to have about ±1V of voltage Vg applied to the gate electrodes 18.

In this way, the spin filter selectively passes either of up-spin electrons or down-spin electrons depending on the gate voltage applied to the gate electrodes 18.

The substance forming the channel region 16 is not limited to the above substance as long as a substance satisfies the above conditions.

As a substance for forming the channel region 16, for example, a structured object made of a bended graphene nanoribbon with an even number of rows may be used. For example, as illustrated in FIG. 11, a part of the graphene nanoribbon between the source region 12 and the drain region 14 may be bended to form the channel region 16.

FIGS. 12A-12B are graphs illustrating an energy band structure of a bent graphene nanoribbon with an even number of rows. FIG. 12A illustrates a state of up-spin electrons, and FIG. 12B illustrates a state of down-spin electrons.

As illustrated in FIGS. 12A-12B, the structured object in which the graphene nanoribbon with an even number of rows is bent has an energy level within the energy range of region B just above the Fermi level, at which only down-spin electrons take the state (see *1 part in FIG. 12B).

FIG. 13 is a graph illustrating a simulation result of a spin-polarized current when applying a bias voltage between the source region 12 and the drain region 14 in the structured object illustrated in FIG. 11 using a non-equilibrium Green function method based on first principles.

The structured object formed with the graphene nanoribbon with an even number of rows passes down-spin electrons but does not pass up-spin electrons as the channel region 16 as illustrated in FIG. 13. Namely, it is verified that a spin filter that can pass only down-spin electrons can be implemented. This is because the energy level $Ec_1$ of down-spin electrons is positioned within the energy range of region B as illustrated in FIG. 14.

Also, as illustrated in *1 part in FIG. 12B, if there exists multiple energy levels in the neighborhood, the number of energy levels that fall into the energy region B can be changed by the voltage applied to the gate electrode 18. This enables to change magnitude of a spin-polarized current flowing between the source region 12 and the drain region 14. Namely, the magnitude of spin-polarized current can be controlled by the voltage applied to the gate electrodes 18.

Also, by applying a voltage to the gate electrodes 18 to move down the energy level of the channel region 16, a down-spin state goes out of region B, whereas the energy level $Ec_2$ of up-spin electrons goes into region A, which makes it possible to implement a spin filter that passes only up-spin electrons. The energy level $Ec_2$ of up-spin electrons corresponds to, for example, the energy level designated with *2 in FIG. 12A.

Alternatively, for example, as illustrated in FIG. 16, the graphene nanoribbon with an even number of rows that forms the source region 12 and the graphene nanoribbon with an even number of rows that forms the drain region 14 may be connected with each other via a single carbon atom or a channel region 16 formed with a ribbon thinner than the graphene nanoribbons.

A single atom and a thin ribbon are degenerated with respect to two spins, which appears in the neighborhood of the Fermi level of the graphene nanoribbons that form the source region 12 and the drain region 14.

In this case, by applying a small gate voltage Vg so that the energy level of the channel region 16 goes within the energy range of region B, it possible to implement a spin filter that passes only down-spin electrons. Also, by applying a greater gate voltage Vg so that the energy level of the channel region 16 goes within the energy range of region A, it possible to implement a spin filter that passes only up-spin electrons.

Next, a manufacturing method of a spin filter will be described with reference to FIG. 1 according to the present embodiment.

First, a silicon carbide (SiC) film is formed on a substrate 10, and processed with heat, for example, at a temperature of 1350° C. Applied with heat, silicon on the surface of the silicon carbide film is evaporated, and a layer of graphene sheet is formed on the surface of the silicon carbide film. Atom arrangement of the graphene sheet can be determined by controlling crystal orientation of the silicon carbide film.

Alternatively, a graphene sheet may be synthesized by a CVD method using a catalyst metal such as cobalt (Co), nickel (Ni), iron (Fe), copper (Cu) or the like, then the synthesized graphene sheet is transferred onto the substrate 10. Atom arrangement of the graphene sheet can be confirmed using an electron microscope or a scanning microscope.

Next, photoresist is applied onto the graphene sheet formed on the substrate 10, on which patterning is performed so that shapes of the source region 12, the drain region 14, the channel region 16 and the gate electrodes 18 are formed using photolithography or electron lithography.

Next, using the photoresist as a mask, patterning is performed on the graphene sheet by reactive ion etching using oxygen (O2) gas, milling using argon (Ar) gas, or the like. In this way, the source region 12, the drain region 14, the channel region 16, and the gate electrodes 18 are formed with a graphene nanoribbon with an even number of rows.

Next, if necessary, metal electrodes are formed on the patterned source region 12 and drain region 14 with a titan (Ti) film, a gold (Au) film, or the like.

Next, a ferromagnetic material is formed in the neighborhood of the source region 12 and the drain region 14 to give magnetic moments to the graphene nanoribbons that forms the source region 12 and the drain region 14.

The ferromagnetic material may be formed to have direct contact with the source region 12 and the drain region 14, or the metal electrodes themselves may be made of a ferromagnetic material. Also, the ferromagnetic material does not necessarily need to have direct contact with the source region 12 and the drain region 14, but may be formed separately from the source region 12 and the drain region 14.

It is sufficient to have the ferromagnetic material magnetized in only one direction because the source region 12 and the drain region 14 are to have magnetic moments in the same direction in the spin filter according to the present embodiment. Therefore, by using an external magnetic field or the like, the ferromagnetic material can be easily magnetized.

The graphene nanoribbon forming the source region 12 and the drain region 14 may be given magnetic moments using other methods such as spin injection.

As described above, electrodes can be easily given magnetic moments using an external magnetic field or the like because the source region 12 and the drain region 14 are formed with the zigzag graphene ribbon with an even number of rows having magnetic moments in the same direction according to the present embodiment. Also, by applying an electric field to the channel region 16 to move the energy level of the channel region 16, it is possible to selectively pass either of up-spin electrons or down-spin electron.

Modified Embodiment

Embodiments are not limited to the above, but various modifications can be made.

For example, although the source region 12 and the drain region 14 are placed adjacent to each other in a direction in which the graphene nanoribbon extends according to the above embodiment, a source region and a drain region are not necessarily provided adjacent to each other in the direction in which the graphene nanoribbon extends.

For example, a graphene nanoribbon forming the source region and a graphene nanoribbon forming the drain region may be placed in parallel with each other. In this case, a channel region may be drawn out from lateral sides of the graphene nanoribbons or longitudinal sides of the graphene nanoribbons.

Also, although the channel region 16 is described with having a single energy level in the above embodiments, a channel region may have multiple energy levels. If there exists an energy level in the energy region of region A that accepts up-spin electrons, no energy levels may exist in the energy region of region B that accepts down-spin electrons. Also, if there exists an energy level in the energy region of region B that accepts down-spin electrons, no energy levels may exist in the energy region of region A that accepts up-spin electrons.

Also, although the spin filter has been described with the above embodiments, the same structured object can be used for forming a spin switch or a spin transistor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A spin filter comprising:
   a first electrode configured to be formed with a zigzag graphene ribbon with an even number of rows extending in a first direction, and to have a magnetic moment in a second direction crossing with the first direction;
   a second electrode configured to be formed with a zigzag graphene ribbon with an even number of rows extending in the first direction, and to have a magnetic moment in the second direction; and
   a channel region configured to be placed between the first electrode and the second electrode, and to have an energy level allowing up-spin electrons or down-spin electrons to pass.

2. The spin filter as claimed in claim 1, wherein a potential difference is applied between the first electrode and the second electrode so that a first energy region is formed through which only the up-spin electrons pass and a second energy region is formed through which only the down-spin electrons pass,
   wherein the channel region has the energy level in the first energy region allowing the up-spin electrons to be accepted.

3. The spin filter as claimed in claim 2, further comprising:
   a gate electrode configured to have the channel region applied with an electric field,
   wherein the energy level of the channel region is moved into the first energy region by applying a voltage to the gate electrode.

4. The spin filter as claimed in claim 1, wherein a potential difference is applied between the first electrode and the second electrode so that a first energy region is formed through which only the up-spin electrons pass and a second energy region is formed through which only the down-spin electrons pass,
   wherein the channel region has the energy level in the second energy region allowing the down-spin electrons to be accepted.

5. The spin filter as claimed in claim 4, further comprising:
   a gate electrode configured to have the channel region applied with an electric field,
   wherein the energy level of the channel region is moved into the second energy region by applying a voltage to the gate electrode.

6. The spin filter as claimed in claim 1, further comprising:
   a gate electrode configured to have the channel region applied with an electric field,
   wherein a potential difference is applied between the first electrode and the second electrode so that a first energy region is formed through which only the up-spin electrons pass and a second energy region is formed through which only the down-spin electrons pass,
   wherein the energy level of the channel region is moved into the first energy region or the second energy region by applying a voltage to the gate electrode.

7. The spin filter as claimed in claim 1, wherein the channel region has the energy level allowing both of the up-spin electrons and the down-spin electrons to be accepted.

8. The spin filter as claimed in claim 1, wherein the channel region is formed with a bent zigzag graphene ribbon with an even number of rows.

9. The spin filter as claimed in claim 1, wherein the channel region is formed with a single carbon atom.

10. The spin filter as claimed in claim 1, wherein the channel region is formed with a zigzag graphene ribbon thinner than the zigzag graphene ribbon forming the first electrode and the second electrode.

11. A method of driving a spin filter, the method comprising:
    forming the spin filter with
       a first electrode configured to be formed with a zigzag graphene ribbon with an even number of rows extending in a first direction, and to have a magnetic moment in a second direction crossing with the first direction,
       a second electrode configured to be formed with a zigzag graphene ribbon with an even number of rows extending in the first direction, and to have a magnetic moment in the second direction,
       a channel region configured to be placed between the first electrode and the second electrode, and to have an energy level allowing up-spin electrons or down-spin electrons to be accepted, and
       a gate electrode configured to have the channel region applied with an electric field,
    giving a potential difference between the first electrode and the second electrode so that a first energy region is formed through which only the up-spin electrons pass and a second energy region is formed through which only the down-spin electrons pass; and
    moving the energy level of the channel region into the first energy region or the second energy region by applying the voltage to the gate electrode.

12. The spin filter driving method as claimed in claim 11, wherein the channel region has the energy level to accept the up-spin electrons, and selectively passes the up-spin electrons by moving the energy level of the channel region into the first energy region by applying the voltage to the gate electrode.

13. The spin filter driving method as claimed in claim 11, wherein the channel region has the energy level to accept the down-spin electrons, and selectively passes the down-spin electrons by moving the energy level of the channel region into the second energy region by applying the voltage to the gate electrode.

14. The spin filter driving method as claimed in claim 11, wherein the channel region has the energy level to accept both of the up-spin electrons and the down-spin electrons.

* * * * *